United States Patent
Chatterjee (12)

(10) Patent No.: US 6,858,486 B2
(45) Date of Patent: Feb. 22, 2005

(54) VERTICAL BIPOLAR TRANSISTOR FORMED USING CMOS PROCESSES

(75) Inventor: Amitava Chatterjee, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 60 days.

(21) Appl. No.: 10/657,529

(22) Filed: Sep. 8, 2003

(65) Prior Publication Data

US 2004/0046183 A1 Mar. 11, 2004

Related U.S. Application Data

(62) Division of application No. 10/261,847, filed on Sep. 30, 2002, now Pat. No. 6,646,311.
(60) Provisional application No. 60/328,670, filed on Oct. 10, 2001.

(51) Int. Cl.[7] .......................................... H01L 21/8238
(52) U.S. Cl. ........................ 438/202; 438/203; 438/207
(58) Field of Search .................................. 257/370, 378; 438/202, 203, 204, 205, 207, 234, 309

(56) References Cited

U.S. PATENT DOCUMENTS 6,030,864 A  *  2/2000  Appel et al. ................ 438/234

* cited by examiner

Primary Examiner—Hoai Pham
(74) Attorney, Agent, or Firm—Yingsheng Tung; Wade James Brady, III; Frederick J. Telecky, Jr.

(57) ABSTRACT

A vertical bipolar transistor is described which utilizes ion implantation steps which are used to form an nMOS field effect device and a pMOS field effect device. The implantation steps form an n-well, a channel stop p-well region and emitter region which are vertically oriented within a semiconductor substrate. The resulting bipolar device is junction isolated from other circuits formed on the substrate by a p-well region.

14 Claims, 3 Drawing Sheets

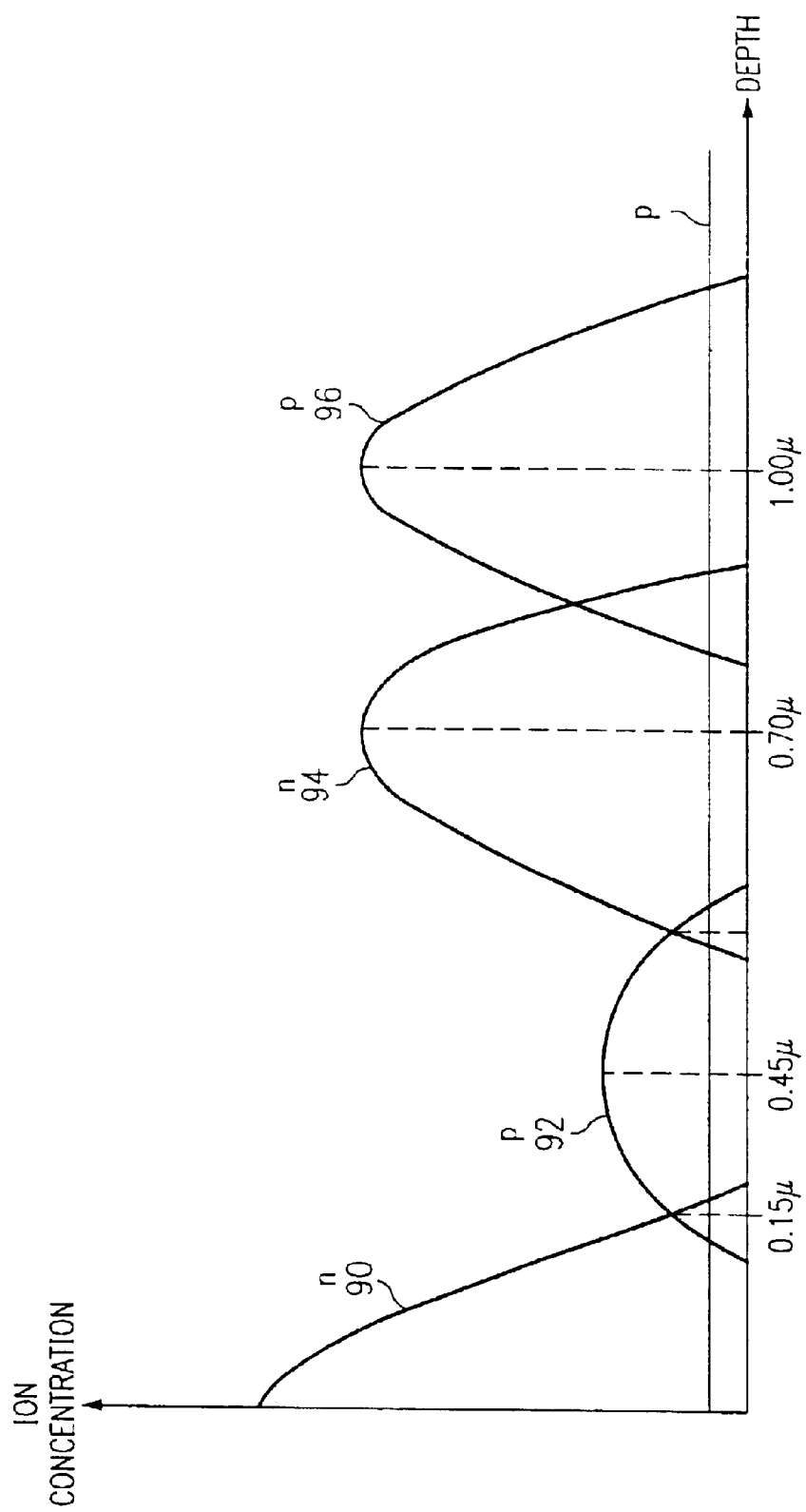

VERTICAL BIPOLAR TRANSISTOR FORMED USING CMOS PROCESSES

This is a divisional application of Ser. No. 10/261,847 filed Sep. 30, 2002, now U.S. Pat. No. 6,646,311 which claims priority under 35 USC 119(e)(1) of provisional application No. 60/328,670.

TECHNICAL FIELD OF THE INVENTION

This invention relates in general to the field of integrated electronic systems and more particularly to the architecture and formation of a vertical bipolar transistor constructed using adjunct CMOS processes.

BACKGROUND OF THE INVENTION

The construction of field effect devices in CMOS technologies involves the use of sequential implant processes to form conductive and semiconductive regions within the outer surface of a semiconductor substrate. These implant processes are optimized to enable the field effect devices to function in complimentary fashion. P-channel devices and n-channel devices are formed on the same substrate using photolithographic processes to cover certain of the devices while implant processes are performed on the remaining devices.

State of the art bipolar transistors require different implant and photolithographic masking processes. Many integrated architectures require or may be optimized if the integrated system can utilize both field effect and bipolar devices on the same integrated substrate. Unfortunately, the use of implant processes to form field effect devices and then subsequent implant processes to form bipolar devices greatly increases the cost and complexity of the formation of the device. As such, designers have attempted to use the same implant processes for the field effect devices to create various bipolar structures within the integrated system. These techniques have been somewhat successful but they have been limited principally because bipolar devices require two junctions. In this regard, many of the bipolar devices that have been integrated with field effect devices have used the substrate itself as one of the active regions of the bipolar device. While this technique can create a functioning bipolar transistor, this technique is limited because the substrate voltage is automatically applied to one terminal of the bipolar device. This greatly limits the operational parameters of such a bipolar device and can reduce the effectiveness of the device in the integrated architecture.

SUMMARY OF THE INVENTION

Accordingly, a need has arisen for a new architecture and techniques for forming a bipolar transistor using the operations used to form CMOS devices in an integrated semiconductor system.

In accordance with the teachings of the present invention, integrated device architectures are provided herein that include vertical bipolar transistors formed using implant steps associated with the formation of adjunct CMOS devices. These techniques substantially reduce or eliminate problems associated with prior device architectures and formation techniques.

In accordance with one embodiment of the present invention, a bipolar device is formed in parallel with an nMOS field effect device and a pMOS field effect device. An n-type source drain implant is used to form the source and drain for the nMOS field effect device and the emitter of a vertical bipolar device. A channel stop implant is used to dope the channels of the field effect devices and is also used to form the base region of the vertical bipolar device. A p-type implant process is used to form the source drain regions of pMOS field effect devices and is also used to form a contact region for the base region of the vertical bipolar device. An n-type implant is used to form an n-type well associated with pMOS field effect devices and is also used to form a collector region disposed inwardly from the base region of the vertical bipolar device. The n-type source drain implant is used to form the emitter region and the source and drain region of nMOS field effect devices. This implant is also used to form a contact region for the collector region of the vertical bipolar device.

An important technical advantage of the present invention inheres in the fact that implant processes which are used to form field effect devices on an integrated substrate can also be used to form vertical bipolar devices on the same substrate. In this manner, bipolar transistors can be used with both pMOS and nMOS field effect devices to create complex BiCMOS circuitry without incurring the complexity and costs associated with conventional techniques for forming these structures.

An important technical advantage of the present invention inheres in the fact that the vertical bipolar device constructed according to one embodiment of the present invention is isolated from substrate of the device by a p-n junction. As such, the collector of the vertical bipolar device can be contacted through the outer substrate surface and can be connected to whatever voltage is desired for the operation of the device. This capability greatly enhances the flexibility of the operation of the device within an integrated circuit.

BRIEF DESCRIPTION OF THE DRAWINGS

A more complete understanding of the teachings of the present invention may be acquired by referring to the accompanying figures in which like reference numbers indicate like features and wherein:

FIG. 3 is a graphical illustration of a dopant concentration profile associated with the device architectures of FIGS. 1 and 2.

DETAILED DESCRIPTION OF THE INVENTION

Figure 1:
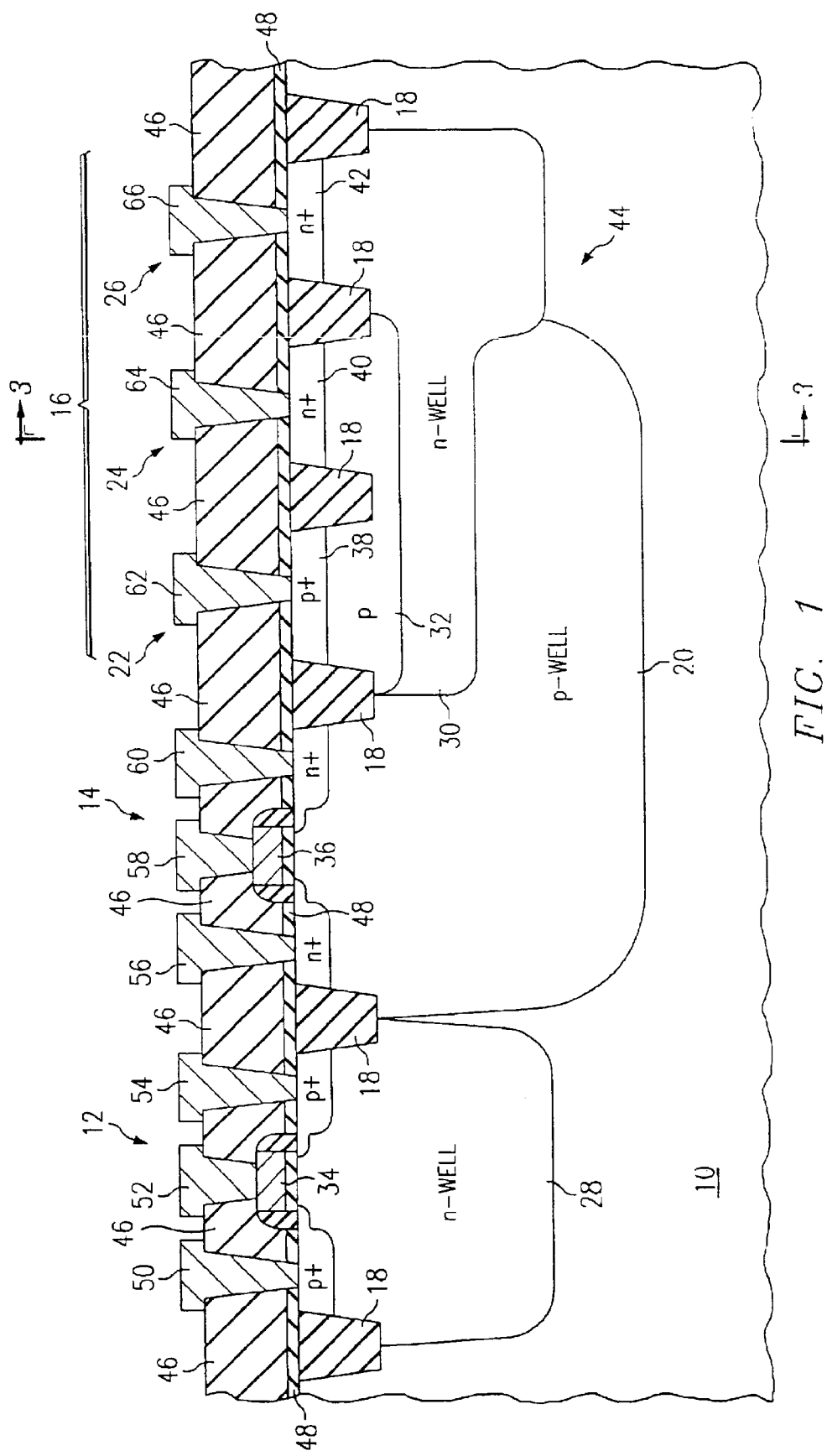
FIG. 1 is a greatly enlarged cross-sectional elevational schematic diagram of an integrated device architecture constructed according to one embodiment of the present invention.

FIG. 1 is an elevational diagram illustrating the completed structure of a number of transistors constructed on a semiconductor substrate 10. According to one embodiment of the present invention, the substrate 10 may comprise a background p-type doping such that the substrate exhibits resistivity on the order of between 2 to 10 ohm-cm. FIG. 1 illustrates a completed pMOS field effect transistor indicated generally at 12, a completed nMOS field effect transistor indicated generally at 14 and a vertical bipolar transistor indicated generally at 16.

The transistors 12, 14 and 16 are formed in the outer surface of substrate 10 by first isolating active regions from each other using trench isolation structures indicated at 18 in FIG. 1. Trench isolation structures 18 are formed by photolithographically patterning the outer surface substrate 10. Trenches are then formed in the outer surface of substrate 10. These trenches are then filled with a dielectric which may comprise, for example, silicon dioxide, silicon nitride. or combination thereof. Trench isolation structures 18 may be on the order of 0.35 microns in depth.

After the active regions within the outer surface of substrate 10 are defined through the formation of trench isolation structures 18, a number of ion implantation steps are performed to define doped regions within substrate 10. Different ion implementation steps are typically used for the nMOS regions as compared to the pMOS regions. An nMOS device such as transistor 14 will typically receive a number of successive implants of boron ions at various energies. Alternatively, a pMOS device such as transistor 12 will typically receive a number of successive implantation steps of either arsenic or phosphorous ions. Although any variety of implantation steps may be performed without departing from the spirit of the present invention, an exemplary set of implantation steps will be presented here for purposes of teaching and managing of the present invention. Accordingly, the embodiment in the disclosed FIG. 1 both transistors 12 and 14 are subjected to a threshold voltage implant, a punch through implant, a channel stop implant, and a well implant. These implantation steps are performed using boron ions for the nMOS region with the pMOS regions being covered by photolithographically defined mask layers. In comparison, the nMOS regions are exposed to the same implant steps using phosphorus or arsenic ions while the nMOS regions are covered with photolithographically defined mask layers. As will be described herein, some of the active regions are allowed to be subjected to both the n-type and p-type ion bombardment steps. According to the teachings of the present invention, this provides for a dopant profile within the substrate 10 which can be used to form a vertical bipolar transistor. In this manner, the ion implantation steps which are used to form and optimize adjunct field effect devices can be utilized to form bipolar structures without altering the character or energy levels of the field effect ion implantation steps and without the expense associated with additional masking steps.

According to one embodiment of the present invention, the nMOS implantation steps comprise a threshold voltage implant step which utilizes boron ions at an energy of 10 keV and an ion dose of approximately 5E12 ions/cm². This is followed by a punch through implantation step of boron ions and an energy of approximately 35 keV and an ion dose of approximately 1E12 ions/cm². Subsequently a channel stop implant step is performed comprising boron ions and an energy of approximately 120 keV and an ion dose of approximately 8E12 ions/cm². Finally, the p-well implant step is performed which comprises boron ions at an energy of approximately 300 keV and an ion dose of approximately 5E13 ions/cm². Referring to FIG. 1, the p-well implant step results in the formation of a p-well 20 shown in FIG. 1. As shown in FIG. 1, the active region associated with transistor 14 is subjected to the p-type ion bombardment. Further, an active region indicated generally at 22 and an active region indicated generally at 24 is also subjected to the p-type ion bombardment. FIG. 1 also illustrates an active region 26 which is only subjected to the n-type ion bombardment. Active regions 22 and 24 are subjected to both n-type and p-type ion bombardments. The active region associated with transistor 12 is subjected only to the n-type ion bombardment at this stage. The ion implantation steps described to this point are used to form internal doped regions within the substrate 10. Subsequent ion implantation steps after the formation of outer structures will be used to form contact regions. As will be discussed herein, the contact regions are highly doped regions of the outer surface of substrate 10. For field effect devices the contact regions are constructed to act as the source and drain regions of the device and typically comprise highly doped p-type regions for a nMOS structure and a highly doped n-type regions for a pMOS structure.

According to one embodiment of the present invention, the n-type ion implantation steps used to construct the bipolar device and the pMOS field effect device begin with a threshold voltage implant of phosphorous or arsenic ions at an energy of approximately 30 keV and an ion dose of approximately 3E12 ions/cm². This is followed by a punch through implant of phosphorous or arsenic ions at an energy of approximately 100 keV and an ion dose of approximately 1E12 ions/cm². Next, a channel stop implant is performed using phosphorous or arsenic ions of approximately 360 keV and an ion dose of approximately 4E12 ions/cm². Finally, an n-well implant comprising phosphorous or arsenic ions is performed at an energy of approximately 500 keV and an ion dose of approximately 5E13 ions/cm². Referring to FIG. 1, the n-well implants step results in the formation of an n-well region 28 associated with transistor 12. In addition, an n-well region 30 is formed in active region 26 and at a slightly shallower depth under active regions 22 and 24 as shown in FIG. 1. The actual dopant profile of the regions discussed herein will be discussed in more detail with reference to FIG. 3. It will be understood by those skilled in the art that the illustration of the regions in FIGS. 1 and 2 with definite demarcations is presented solely for purposes of teaching the present invention. In fact, within an actual semiconductor substrate, the dopant profiles will gradually change from a predominately n-type region to a p-type region as the point of reference travels through the substrate. There is in fact no specific line of demarcation between the n and p-type regions.

Referring again to FIG. 1, it should be noted that due to the fact that active regions 22 and 24 are subjected to both the n-type and p-type ion bombardments, a number of vertically oriented regions are formed. As shown in FIG. 1, the depth of p-well 20 as compared to n-well 30 creates a p-type region disposed inwardly from n-well region 30 in regions 22 and 24. In addition, the n-type channel stop implant is typically performed at a dose on the order of 4E12 ions/cm². In comparison, the p-type channel stop implant typically comprises boron ions at an energy on the order of 8E12 ions/cm². Accordingly, the overlay of these two ion implantation steps results in a channel stop p-well indicated at 32 in FIG. 1. Channel stop p-well extends both active regions 22 and 24. Due to the energy of this implantation step the channel stop p-well is slightly deeper than the isolation structures 18 and as such a conductive path is formed between active regions 22 and 24.

Following the completion of the implantation steps described previously, a post implant anneal step can be used to activate the regions and to smooth the dopant profiles within the regions and to heal any implantation damage that occurred during the processing. This post implant anneal may comprise, for example, a suitable rapid thermal anneal process.

Following the anneal step a series of processes are used to form the gate stacks for the field effect devices 12 and 14. These processes result in the formation of a nMOS gate stack 34 and a pMOS gate stack 36 shown in FIG. 1. A number of suitable techniques may be used to form suitable gate stacks for the field effect devices 12 and 14. However, these processes will typically involve the formation of a suitable gate oxide layer followed by the formation of the gate conductor body typically comprising doped polysilicon material. The poly-silicon gate conductor and gate oxide are then patterned and etched to form the central portion of the gate stacks 34 and 36. A self-aligned drain extension implant process is then used to partially form the source and drain region of the field effect devices 12 and 14. For pMOS device 12 the drain extension implant will comprise an implantation of boron ions. In comparison, the drain extension implant for nMOS device 14 will comprise an implantation of arsenic or phosphorous ions. Following the drain extension implants sidewall insulators bodies are formed on opposing walls of the central gate structures and the final source and drain implants are performed. As before, boron ions are implanted to form the source and drain regions of device 12 and arsenic or phosphorous ions are implanted to form the source and drain regions of device 14. The drain extension implants and source drain implants steps may comprise any suitable energy level and dosage to achieve a suitably conductive region for the operation of the field effect devices 12 and 14. For example, the p-type implant may comprise an implantation of boron ions at an energy of 5 keV and a dose of 1E15 ions/cm$^2$ and the n-type implants may comprise the implantation of arsenic at an energy of 10 keV and a dose of 1E15 ions/cm$^2$.

Referring again to the bipolar device formed in active regions 22, 24 and 26, the drain extension implant and source drain implants are used to form contact regions or active regions within the bipolar device. For example, the implantation of the boron ions used to form the source and drain of device 12 is also used to form a p-type contact region 38 shown in FIG. 1. Contact region 38 acts as a contact point for electrical connection to channel stop p-well region 32. In comparison, the implantation of phosphorous or arsenic ions that were used to form the source and drain regions of device 14 are used to form an emitter region 40 disposed on the outer surface of substrate 10 in contact with a portion of region 32. In addition, this same implantation step of phosphorous or arsenic ions is used to form a contact region 42 in contact with n-well region 30 and disposed on the outer surface of substrate 10 within active region 26. The regions formed in active regions 22, 24 and 26 together form a vertical bipolar transistor indicated generally at 44 which comprises an emitter region 40. Contact region 38 serves to electrically connect to channel stop p-well region 32 which acts as the base of bipolar transistor 44. Finally, contact region 42 acts as an electrical connection to n-well region 30 which acts as the collector of bipolar transistor 44. Transistor 44 is junction isolated from other devices formed on substrate 10 by the combination of p-well 20 and the background p-type dopant within substrate 10. As such, the collector of transistor 44, namely the n-well region 30, can be biased or operate at any suitable voltage without interfering with the operation of other devices formed in substrate 10.

The integrated structure shown in FIG. 1 is completed by first forming an inter-level dielectric layer 46. Layer 46 may comprise a layer of silicon dioxide or a combination of a layer of silicon dioxide and an etch stop layer 48 shown in FIG. 1 which may comprise, for example, silicon nitride. The dielectric layers 46 and 48 may be patterned and etched using suitable photolithographic processes to form contact openings. These openings may then be filled with suitable conductive material such as aluminum or copper to form a source contact 50, a gate contact 52 and a drain contact 54 associated with field effect device 12. In addition, the same conductive material may be used to form a source contact 56, a gate contact 58 and a drain contact 60 of field effect device 14. Finally, the conductive material may also be used to form a base contact 62 and emitter contact 64 and a collector contact 66 associated with bipolar device 44.

Figure 2:
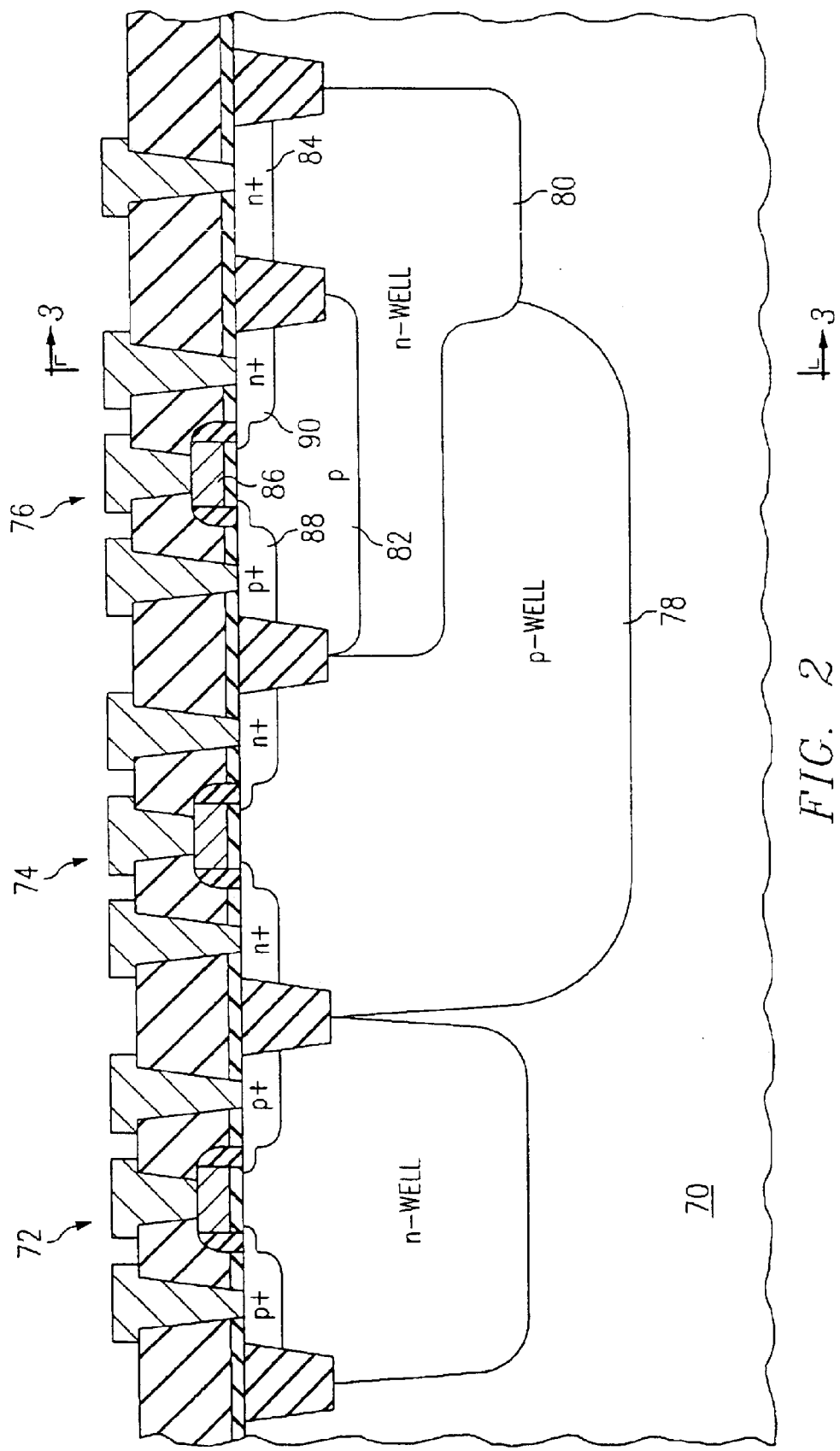
FIG. 2 is a greatly enlarged cross-sectional elevational schematic diagram of an alternate embodiment of an integrated device architecture constructed according to the teachings of the present invention.

FIG. 2 illustrates an alternate embodiment of an integrated structure according to the teachings of the present invention. Many of the structures shown in FIG. 2 are identical to those shown in FIG. 1 and, as such, only the distinctions between the two devices will be described herein. The structure shown in FIG. 2 are constructed on a semiconductor substrate 70 which is identical to substrate 10 discussed with reference to FIG. 1. FIG. 2 also illustrates a pMOS field effect device indicated generally at 72 which is identical to device 12 discussed with reference to FIG. 1. FIG. 2 also illustrates a nMOS field effect device 74 which is identical to nMOS device 14 discussed with reference to FIG. 1. FIG. 2 also illustrates a vertical bipolar transistor 76 which is constructed in a similar fashion to transistor 44 discussed with reference to FIG. 1 but with certain distinctions. The same implantation procedures may be followed to construct a p-well region 78 and n-well region 80 and a channel stop p-well region 82 as shown in FIG. 2. These regions are identical to regions 20, 30 and 32, respectively discussed with reference to FIG. 1. In addition, the identical drain extension and source drain implants may be used to construct a collector contact region 84 which is identical to region 42 discussed with reference to FIG. 1. Transistor 76 is different than transistor 44 in that it does not utilize two active regions separated by a trench isolation structure 18 for the formation of the base and emitter of device 76. Transistor 44 utilized active region 22 for the formation of the base of transistor 44 and active region 24 for the formation of the emitter of transistor 44. As such, the base of transistor 44 which was formed by channel stop p-well region 32 needed to be deep enough to have an electrically conductive path disposed inwardly from trench isolation structure 18. Transistor 76 alleviates this need by utilizing a different technique to isolate the base and the emitter from one another.

Referring to FIG. 2, a sacrificial gate stack structure 86 is formed on the outer surface of substrate 70 between a base contact region 88 and a emitter region 90. As can be seen in FIG. 2, region 88 and region 90 are identical in profile to the source and drain regions of the field effect devices 72 and 74. Similarly, sacrificial gate stack structure 86 is identical to a active gate stack structure that may be used in any field effect device. In other words, sacrificial gate stack structure 86 comprises a gate insulator, a gate conductor and sidewall insulator bodies just as would a gate stack structure for any active field effect device. However, structure 86 is not an active gate of a field effect device but serves as an implant mask so that the implant processes used to form contact region 88 and emitter region 90 can be self aligned to the edges of structure 86. During the implantation of boron ions used in the formation of source and drain regions of pMOS devices and in the formation of contact region 88 the outer surface of substrate 70 proximate region 90 is covered with photolithographically defined mask structures. In comparison, during the implantation of phosphorous or arsenic ions used to form emitter region 90 and the source and drain regions of nMOS devices, such as device 74 and contact region 84, the outer surface of substrate 70 proximate regions 88 and the area associated with device 72 are covered with photolithographically defined masked structures. By using the sacrificial gate stack structure 86, the ion implantation process used to form region 82 may be designed so that region 82 does not need to extend into substrate 70 deeper than the trench isolation structures defining active regions.

In order to finish the device, the same contact conductive bodies are formed through an isolation layer comprising dielectric materials such as silicon dioxide or silicon nitride, or combination thereof. These structures are identical to those described with reference to FIG. 1. It should be noted that although the sacrificial gate stack structure 86 is not electrically active in the sense that it does not control or activate a channel through any field effects, it may typically be tied to some predetermined voltage or controlled voltage signal. If it is not electrically connected to some potential, free charge could accumulate in the conductive regions of the gate stack structure 86 and work to change or deteriorate the operating characteristics of the device 86. The gate stack structure 86 may be electrically connected to a predetermined supply voltage or it may be strapped electrically to the emitter region 90. If it is connected electrically to emitter 90, the base to emitter voltage of device 76 will be placed across the gate oxide layer within gate stack structure 86. As such, in this configuration, the base to emitter voltage of the device may not exceed the breakdown voltage of the gate oxide used to form the active field effect devices of 72 and 74.

FIG. 3 is a graphical illustration of the approximate dopant profiles of the structure shown in FIGS. 1 and 2 taken along a line 3—3 shown in FIGS. 1 and 2. Referring to FIG. 3, the emitter contact region is shown as a highly concentrated n-type region 90 shown in FIG. 3. The channel stop p-well region is shown as a lower concentrated p-type region 92 in FIG. 3. The center point of region 92 is approximately 0.45 microns from the outer surface of substrate 10 or substrate 70 shown in FIGS. 1 and 2, respectively. The junctions of regions 90 and 92 will typically be on the order of 0.15 microns from the surface of the substrate. Referring again to FIG. 3, the n-well region 30 or 80 is shown in FIG. 3 of an n-type region 94. The high point of the concentration occurs at approximately 7 microns from the surface of the substrates. Finally, a p-type region 96 shown in FIG. 3 corresponds to the p-well regions 20 and 78 shown in FIGS. 1 and 2, respectively. The dopant concentration of region 96 typically occurs approximately 1 micron from the surface of the substrate. One advantage of the embodiment shown in FIGS. 1 and 2 is that the base regions of the device which correspond to region 92 shown in FIG. 3 are associated with a relatively low Gummel number. The Gummel number is related to the number of carriers within the base region. In general, the Gummel number is inversely proportional to the possible gain which may be realized from the operation of the bipolar device. As such, the use of a relatively low dopant concentration within the base region of the resulting bipolar devices results in a potentially high gain available for the operation of the devices.

It should be understood that the dopant energies and concentrations described herein are solely for the purposes of teaching several specific embodiments of the present invention and a myriad of other dopant profiles concentrations and dosages maybe similarly implemented according to the teachings of the present invention. Similarly, the examples presented herein result in the formation of an NPN bipolar device. The same technique could easily be adapted to the formation of a PNP device or other more complex structures.

Accordingly, although the present invention has been described in detail, it should be understood that any number of alterations, substitutions, or modifications may be made to the teachings described herein without departing from the spirit and scope of the present invention which is solely defined by the appended claims.

What is claimed is:

1. A method for forming a plurality of transistors proximate an outer surface of a semiconductor substrate comprising:
    forming a collector region of a bipolar transistor and a well region of a first field effect transistor by implanting ions having a first conductivity type in a first common ion implantation step;
    forming a base region of the bipolar transistor and doping the channel region of a second field effect transistor by implanting ions having a second conductivity type using a second common ion implantation step; and
    forming an emitter region of the bipolar device and source and drain regions of the second field effect device by implanting ions of the first conductivity type into the outer surface of the substrate using a third common ion implant step.

2. The method of claim 1 wherein the third common implant step is also used to form a collector contact region proximate the outer surface of the substrate and electrically coupled to the collector region.

3. The method of claim 1 and further comprising the step of forming source and drain regions of the first field effect device and forming a base contact region by implanting ions of the second conductivity type into a region of the outer surface of the substrate using a fourth common ion implant step.

4. The method of claim 1 wherein the ions of the first conductivity type comprise n-type ions and the ions of the second conductivity type comprise p-type ions.

5. The method of claim 4 wherein the p-type ions comprise boron ions.

6. The method of claim 4 wherein the n-type ions comprise ions chosen from a class consisting of phosphorous and arsenic.

7. The method of claim 1 wherein the semiconductor substrate is doped with ions of the second conductivity type such that the collector region is junction isolated from other electronic devices formed in the substrate.

8. The method of claim 1 and further comprising the step of forming a isolation insulator body proximate the outer surface of the substrate and disposed between the collector region and the emitter region.

9. The method of claim 1 and further comprising the step of forming a isolation insulator body proximate the outer surface of the substrate and disposed between the emitter region and a base contact region electrically connected to the base region.

10. The method of claim 1 and further comprising the step of forming a sacrificial gate stack structure disposed outwardly from the outer surface of the substrate and disposed between the emitter region and a base contact region disposed proximate the outer surface of the substrate and electrically coupled to the base region.

11. A method for forming a plurality of transistors proximate an outer surface of a semiconductor substrate comprising:
    forming a collector region of a bipolar transistor and a well region of a first field effect transistor by implanting ions having a first conductivity type in a first common ion implantation step;
    forming a base region of the bipolar transistor and doping the channel region of a second field effect transistor by implanting ions having a second conductivity type using a second common ion implantation step;

forming an emitter region of the bipolar device and source and drain regions of the second field effect device by implanting ions of the first conductivity type into the outer surface of the substrate using a third common ion implant step;

forming a collector contact region proximate the outer surface of the substrate and electrically coupled to the collector region using the third common implant step; and forming source and drain regions of the first field effect device and forming a base contact region by implanting ions of the second conductivity type into region of the outer surface of the substrate using a fourth common ion implant step.

12. The method of claim 11, wherein the ions of the first conductivity type comprise n-type ions and the ions of the second conductivity type comprise p-type ions.

13. The method of claim 12, wherein the p-type ions comprise borons.

14. The method of claim 12, wherein the n-type ions comprise ions chosen from a class consisting of phosphorous and arsenic.

* * * * *